(12) United States Patent
Gaudynska et al.

(10) Patent No.: US 12,256,510 B2
(45) Date of Patent: Mar. 18, 2025

(54) SEALING SYSTEM FOR TELECOMMUNICATION CLOSURES

(71) Applicant: Corning Research & Development Corporation, Corning, NY (US)

(72) Inventors: Marta Eliza Gaudynska, Lodz (PL); Przemyslaw Andrzej Kukian, Łódź (PL); Marcin Kusmierek, Lodz (PL)

(73) Assignee: CORNING RESEARCH & DEVELOPMENT CORPORATION, Corning, NY (US)

( * ) Notice: Subject to any disclaimer, the term of this patent is extended or adjusted under 35 U.S.C. 154(b) by 160 days.

(21) Appl. No.: 17/957,550

(22) Filed: Sep. 30, 2022

(65) Prior Publication Data
US 2023/0100339 A1  Mar. 30, 2023

Related U.S. Application Data

(60) Provisional application No. 63/250,753, filed on Sep. 30, 2021.

(51) Int. Cl.
*H05K 5/03* (2006.01)
*H05K 5/02* (2006.01)

(52) U.S. Cl.
CPC ............ *H05K 5/0247* (2013.01); *H05K 5/03* (2013.01)

(58) Field of Classification Search
CPC .................................................. H05K 5/0247
See application file for complete search history.

(56) References Cited

U.S. PATENT DOCUMENTS

| | | | | |
|---|---|---|---|---|
| 5,517,592 | A * | 5/1996 | Grajewski | G02B 6/4446 385/100 |
| 9,685,776 | B2 * | 6/2017 | Coenegracht | F16J 15/104 |
| 11,038,333 | B2 * | 6/2021 | Schönfeld | H05K 5/03 |
| 11,268,552 | B2 * | 3/2022 | Clavelle | F16B 37/045 |
| 11,561,354 | B2 * | 1/2023 | Wittmeier | G02B 6/4444 |
| 11,968,793 | B1 * | 4/2024 | Bannick | H05K 7/1432 |
| 2013/0320631 | A1 | 12/2013 | Vastmans et al. | |
| 2015/0137461 | A1 * | 5/2015 | Coenegracht | G02B 6/4444 277/618 |
| 2015/0345668 | A1 * | 12/2015 | Blaser | F16L 5/02 277/606 |

(Continued)

FOREIGN PATENT DOCUMENTS

| | | | |
|---|---|---|---|
| AU | 2012252494 B2 | 7/2016 | |
| GB | 2546750 A * | 8/2017 | ......... H02G 15/007 |
| WO | 2020/061283 A1 | 3/2020 | |

OTHER PUBLICATIONS

European Patent Application No. 22198783.7 European Search Report and Written Opinion dated Feb. 13, 2023; 10 pages European Patent Office.

*Primary Examiner* — Xanthia C Relford
(74) *Attorney, Agent, or Firm* — Tamika A. Crawl-Bey

(57) ABSTRACT

A sealing system for a telecommunication closure includes an endcap having a plurality of slotted areas defined therein; and a plurality of sealing segment assemblies mounted to the endcap that when combined form a substantially continuous sealing perimeter around the endcap. Each sealing segment assembly is disposed in one of the plurality of slotted areas and includes an inner segment and an outer segment that when mated together are configured to seal at least one cable routed through a cable port opening.

20 Claims, 8 Drawing Sheets

(56) References Cited

U.S. PATENT DOCUMENTS

| | | | |
|---|---|---|---|
| 2019/0293888 A1* | 9/2019 | Bryon | H02G 15/013 |
| 2020/0249407 A1 | 8/2020 | Aznag et al. | |
| 2021/0255409 A1 | 8/2021 | Geens et al. | |
| 2022/0382008 A1* | 12/2022 | Coenegracht | G02B 6/44775 |
| 2023/0100339 A1* | 3/2023 | Gaudynska | H05K 5/0247 |
| | | | 361/679.01 |
| 2023/0110669 A1* | 4/2023 | Kubiak | G02B 6/4477 |
| | | | 385/135 |
| 2024/0310594 A1* | 9/2024 | Cloud | G02B 6/4444 |

* cited by examiner

SEALING SYSTEM FOR TELECOMMUNICATION CLOSURES

CROSS-REFERENCE TO RELATED APPLICATION

This application claims the benefit of priority under 35 U.S.C. § 119 of U.S. Provisional Application No. 63/250,753, filed Sep. 30, 2021, the content of which is relied upon and incorporated herein by reference in its entirety.

BACKGROUND

The present disclosure relates generally to sealing systems for telecommunication closures, and particularly for dome-type telecommunication closures.

Telecommunication systems include various networks, subsystems and components that allow for the transmission of data and voice signals over long distances. Telecommunication closures (also referred to in the telecommunications industry as enclosures) and telecommunication cables make up part of these networks and subsystems. Telecommunication cables include, but are not limited to fiber optic cables, copper cables, or hybrid cables having a combination of copper and fiber optic cables. Telecommunication closures house and protect components such as splices, termination panels, power splitters and wavelength division multiplexers, which are used in telecommunication systems.

Telecommunication closures are typically sealed to protect components inside of the closure from environmental exposure. For example, telecommunication closures are designed to inhibit the intrusion of moisture, bugs, and other types of contaminants. While some types of sealing systems for telecommunication closures are effective, there is still a need for improvements in this area.

SUMMARY

Disclosed herein are various embodiments of integrated cable port and perimeter sealing systems, telecommunication closures, and methods of using such sealing systems and closures in telecommunication systems. In comparison to prior art sealing systems used in telecommunication closures, the embodiments disclosed herein provide According to a first aspect of the disclosure, a sealing system for telecommunication closures includes an endcap having a plurality of slotted areas defined therein; and a plurality of sealing segment assemblies mounted to the endcap that when combined form a substantially continuous sealing perimeter around the endcap. Each sealing segment assembly is disposed in one of the plurality of slotted areas and includes an inner segment and an outer segment that when mated together are configured to seal at least one cable routed through a cable port opening.

According to another aspect of the disclosure, a telecommunication closure includes a cover assembly having a cover and a sealing system. The sealing system sealing system includes an endcap having a plurality of slotted areas defined therein; and a plurality of sealing segment assemblies mounted to the endcap that when combined form a substantially continuous sealing perimeter around the endcap. Each sealing segment assembly is disposed in one of the plurality of slotted areas and includes an inner segment and an outer segment that when mated together are configured to seal at least one cable routed through a cable port opening.

And, according to another aspect of the disclosure a method of sealing a cable disposed in a telecommunication closure includes the steps of positioning an inner segment into a slotted area of an endcap; positioning an outer segment into the slotted area; and coupling the outer segment and the inner segment assembly together to form a cable port seal around one or more cables.

Additional aspects, features and advantages will be set forth in the detailed description which follows, and in part will be readily apparent to those skilled in the art from that description or recognized by practicing the embodiments as described herein, including the detailed description which follows, the claims, as well as the appended drawings.

It is to be understood that both the foregoing general description and the following detailed description are merely exemplary, and are intended to provide an overview or framework to understanding the nature and character of the claims. The accompanying drawings are included to provide a further understanding, and are incorporated in and constitute a part of this specification. The drawings illustrate embodiments, and together with the description serve to explain principles and operation of the various embodiments.

BRIEF DESCRIPTION OF THE DRAWINGS

The figures are not necessarily to scale. Like numbers used in the figures may be used to refer to like components. However, it will be understood that the use of a number to refer to a component in a given figure is not intended to limit the component in another figure labeled with the same number.

DETAILED DESCRIPTION

Various exemplary embodiments of the disclosure will now be described with particular reference to the drawings. Exemplary embodiments of the present disclosure may take on various modifications and alterations without departing from the spirit and scope of the disclosure. Accordingly, it is to be understood that the embodiments of the present disclosure are not to be limited to the following described exemplary embodiments, but are to be controlled by the features and limitations set forth in the claims and any equivalents thereof.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

As used in this specification and the appended claims, the singular forms "a," "an," and "the" encompass embodiments having plural referents, unless the content clearly dictates otherwise. As used in this specification and the appended claims, the term "or" is generally employed in its sense including "and/or" unless the content clearly dictates otherwise.

Spatially related terms, including but not limited to, "lower," "upper," "beneath," "below," "above," and "on top," if used herein, are utilized for ease of description to describe spatial relationships of an element(s) to another. Such spatially related terms encompass different orientations of the device in use or operation in addition to the particular orientations depicted in the figures and described herein. For example, if an object depicted in the figures is turned over or flipped over, portions previously described as below or beneath other elements would then be above those other elements.

Cartesian coordinates are used in some of the Figures for reference and are not intended to be limiting as to direction or orientation.

For purposes of description herein, the terms "upper," "lower," "right," "left," "rear," "front," "vertical," "horizontal," "top," "bottom," "side," and derivatives thereof, shall relate to the disclosure as oriented with respect to the Cartesian coordinates in the corresponding Figure, unless stated otherwise. However, it is to be understood that the disclosure may assume various alternative orientations, except where expressly specified to the contrary.

For the purposes of describing and defining the subject matter of the disclosure it is noted that the terms "substantially" and "generally" may be utilized herein to represent the inherent degree of uncertainty that may be attributed to any quantitative comparison, value, measurement, or other representation.

Figure 1:
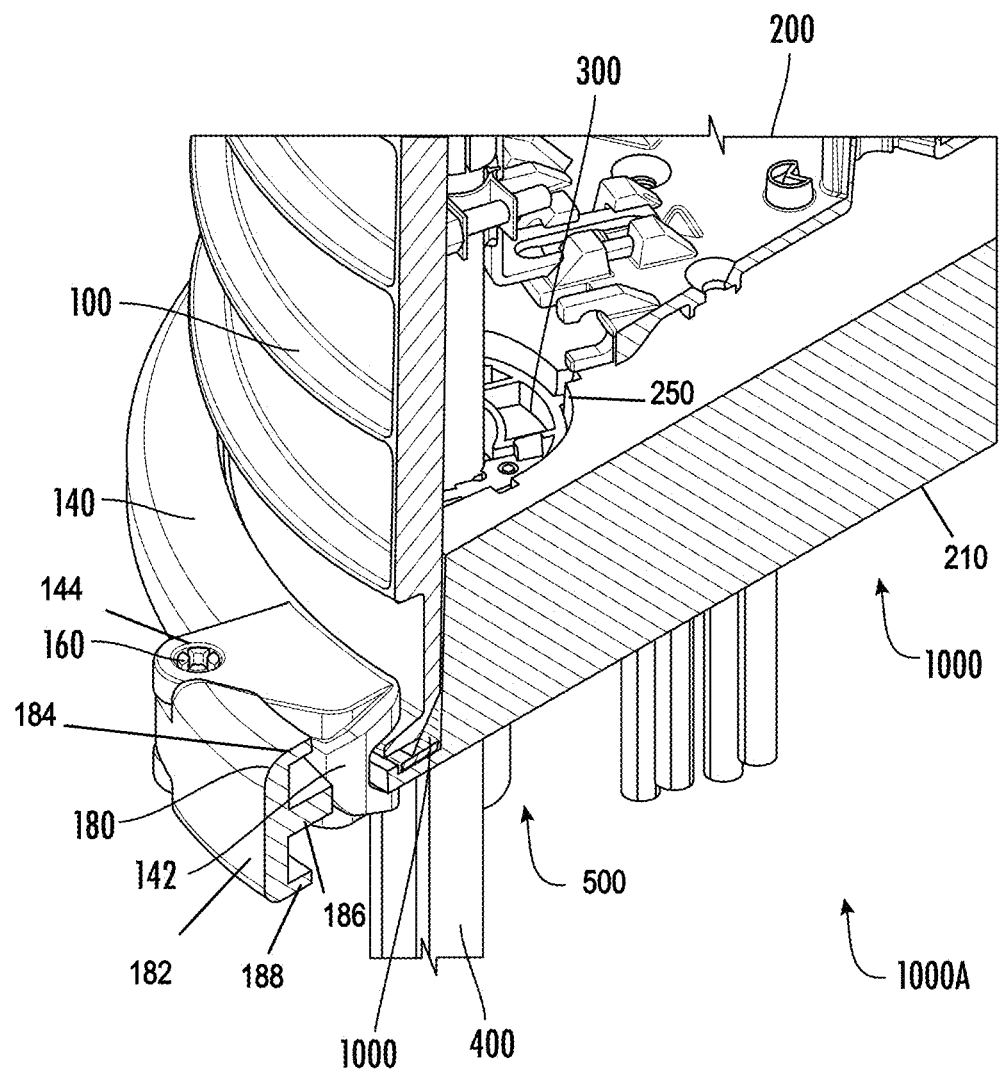
FIG. 1 is a partial isometric view of a cross-section of a telecommunication closure, including a sealing system, in accordance with embodiments disclosed herein.
Figure 2:
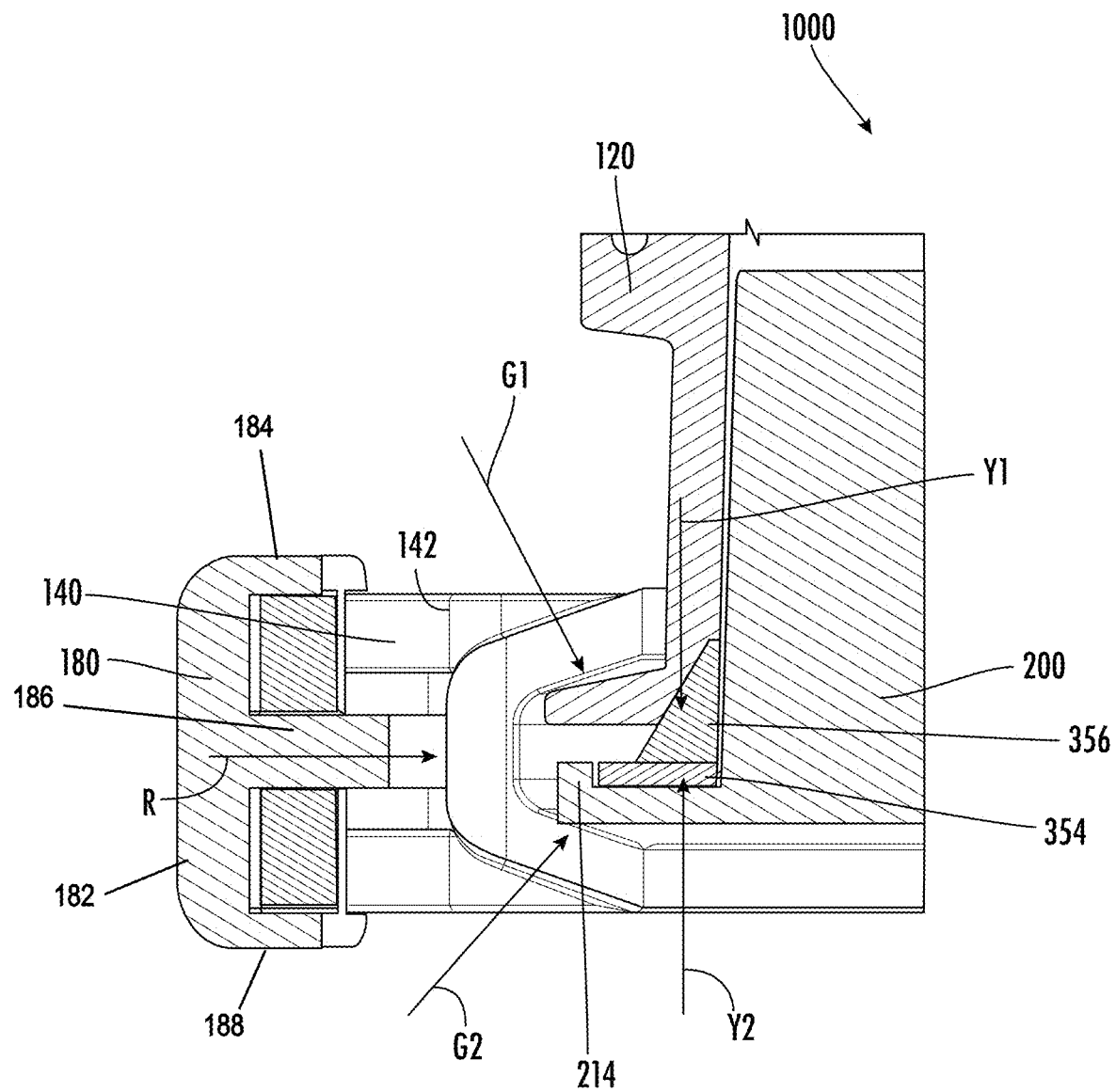
FIG. 2 is a partial cross-sectional side view of the telecommunication shown in FIG. 1.

FIGS. 1 and 2 illustrate an embodiment of a closure 1000A in which a plurality of sealing segment assemblies 300 can be mounted to form a sealing system 1000. The closure 1000A includes a cover assembly 100, an endcap 200 or base coupled to the cover assembly 100, a plurality of sealing segment assemblies 300 disposed within slotted areas 250 of the endcap 200, and a plurality of cables 400 (FIG. 1) at least some of which are configured to route through at least one sealing segment assembly and form a cable port seal 500.

Other components may also be included in the closure, as will be further described herein. The plurality of sealing segment assemblies 300 is mounted to the endcap 200 such that together or upon combination, the plurality forms a substantially continuous sealing perimeter around the endcap, i.e. with minimal gaps between sealing elements contained in the sealing system.

The cover assembly 100 is removable from the endcap 200. The cover assembly 100 includes a cover 120 or cannister, a clamping ring 140, a cover fastener 160, and a cover sealing element 180. In this exemplary embodiment, the cover is a dome-type cover, which extends upwardly and around the endcap to enclose various components contained therein.

The clamping ring 140 is positionable over a portion of the cover 120 and includes a clamping arm 142. Disposed in the clamping arm 142 is an aperture 144 configured to hold the cover fastener 160. The cover fastener 160 is configured to mechanically hold at least a portion of the clamping arm 142 together such that the clamping arm applies force against the cover sealing element 180 and the endcap, as schematically shown in FIG. 2. The cover fastener may have a nut and bolt configuration or may be a screw or some other type of mechanical fastener. The cover sealing element 180 includes an outer sealing portion 182, an upper sealing portion 184, a middle sealing portion 186, and a lower sealing portion 188. Each sealing portion of the cover sealing element extends toward the clamping arm 142 to apply a force, as schematically represented by arrow R, as shown in FIG. 2. Arrows G1, G2, Y1, Y2 further schematically represent the forces in the sealing system when assembled with the cover assembly.

The endcap 200 and the cover assembly 100 cooperate to define an interior when the cover assembly 100 is mounted to the endcap 200. The interior is of sufficient size and shape to contain a variety of components, which are commonly included in fiber optic closures. Such components include, but are not limited to strain relief assemblies, splice trays, splitters, wavelength division multiplexers, etc.

FIGS. 3, 4A, and 5-7 further illustrate the sealing system 1000 with the cover assembly removed. The endcap 200 includes an endcap body 210 having a plurality of slotted areas 250 disposed therein. In the embodiment as shown particularly in FIG. 5, the endcap 200 includes eight slotted areas 250. The number of slotted areas included in the endcap, however, should not be construed as limiting. Fewer or additional slotted areas can be included in the endcap depending upon application requirements, the size or footprint of the closure, manufacturing parameters, etc.

Figure 4A:
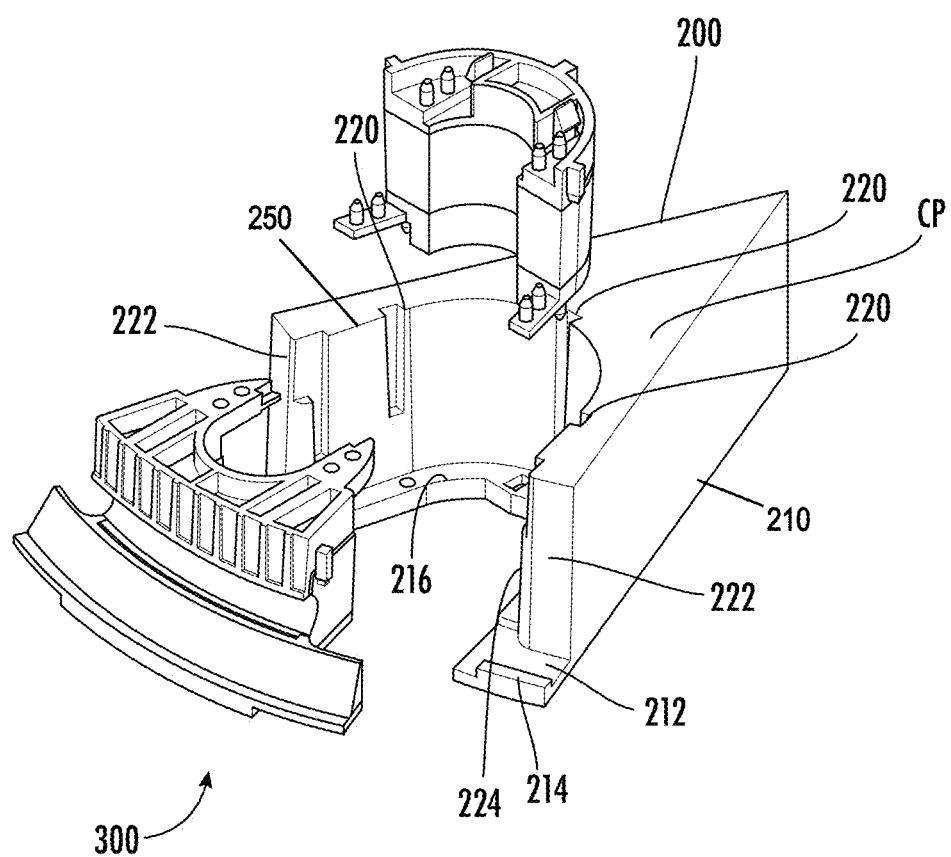
FIG. 4A is an exploded view of a sealing segment assembly and an endcap included in the telecommunication closure shown in FIG. 3.

FIG. 4A illustrates a portion of the endcap body 210 with additional detail included in each slotted area 250. The endcap body 210 includes an outer endcap rim 212 having an upwardly extending edge 214 and an inner endcap step 216 positioned higher than the outer endcap rim 212. A portion of each slotted area has a curved profile CP, having a semi-circular section. A plurality of elongated notches 220 is positioned at intervals along the inner surface of each slotted area 250. At least some of the notches are preferably configured to engage with complimentary surfaces of each respective sealing segment assembly 300. Extending from end faces 222 of the endcap are tangs 224, which facilitate alignment and connection of the sealing segment assembly 300 into the slotted area 250.

Figure 4B:
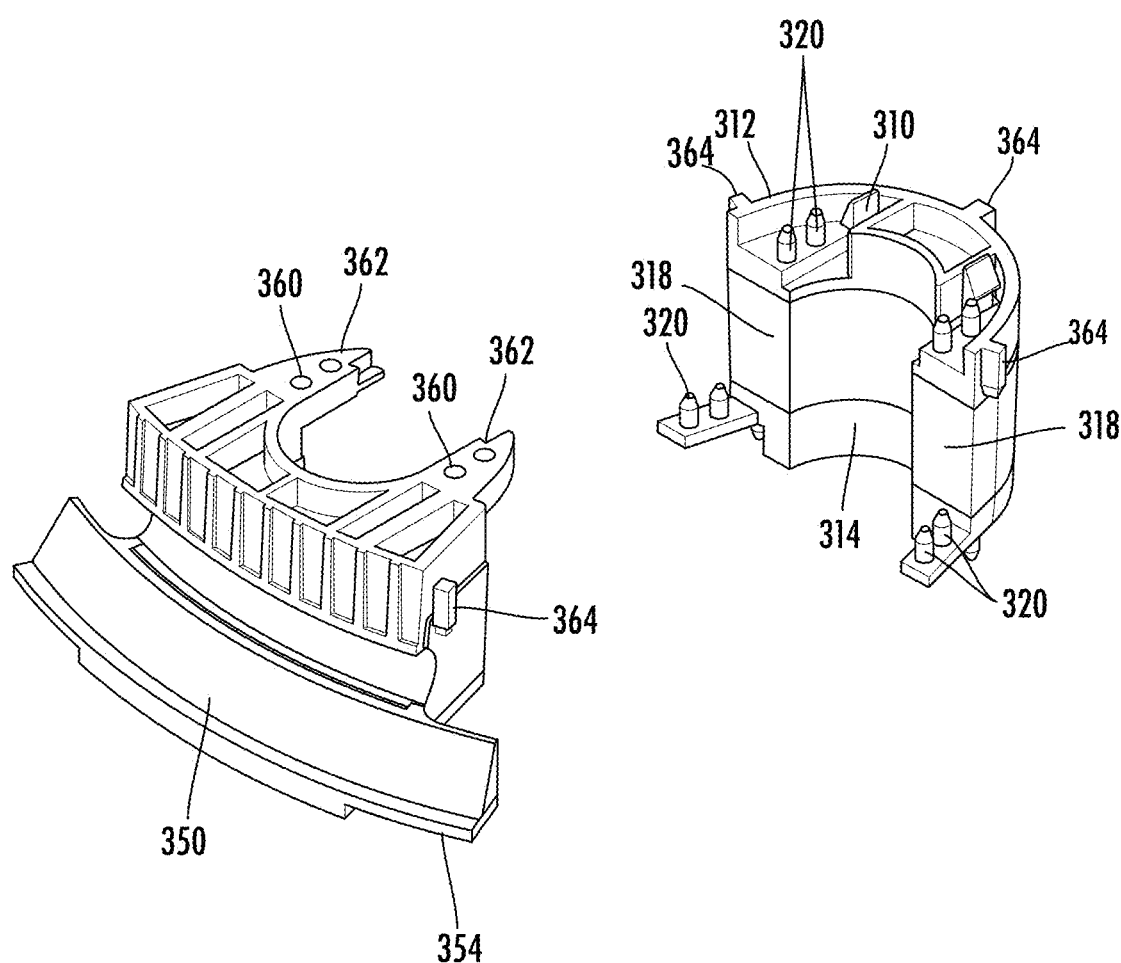
FIG. 4B illustrates the sealing segment assembly shown in FIG. 4A.
Figure 5:
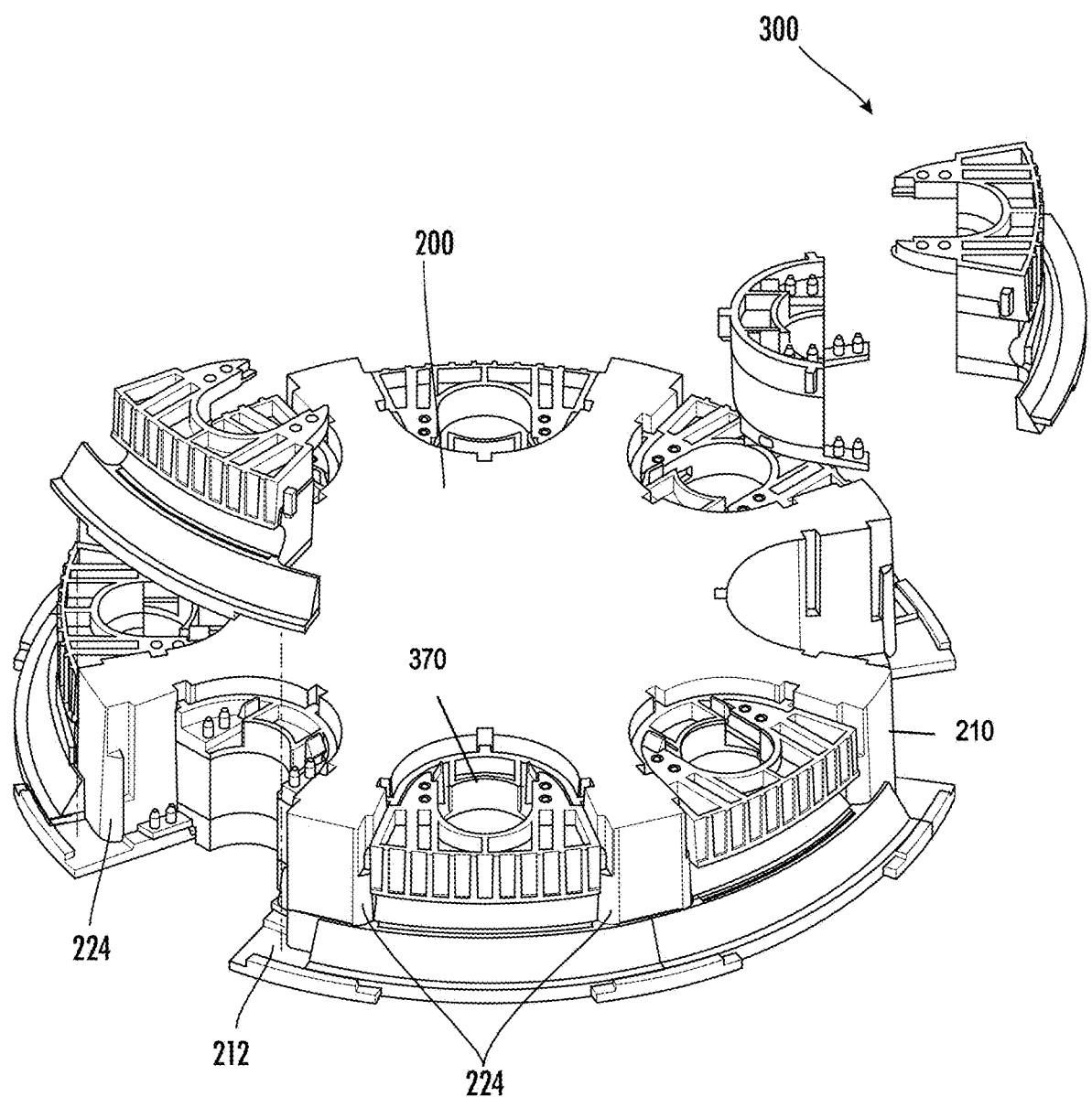
FIG. 5 is a partially exploded isometric view of a plurality of sealing segment assemblies and an endcap in accordance with embodiments disclosed herein.

Referring particularly to FIG. 4B, each sealing segment assembly 300 includes an inner segment 310 and an outer segment 350 that mate together. Each inner segment 310 has an upper segment portion 312, a lower segment portion 314, and an inner segment seal 318 disposed between the upper segment portion 312 and the lower segment portion 314. Each upper segment portion 312, lower segment portion 314, and inner segment seal 318 has an arc shape and substantially flat forward-facing surfaces that allow for mating of the inner segment 310 with the outer segment 350. The upper segment portion 312 and the lower segment portion 314 also include a plurality of protruding mating elements 320 configured for insertion into the upper segment element 362 of the outer segment 350.

Still referring to FIG. 4B, each outer segment 350 has an upper segment element 362, an outer perimeter element 354, and an outer segment seal 356 disposed between the upper segment element 362 and the outer perimeter element 354. Each upper segment element 362, outer perimeter element 354, and outer segment seal 356 has an arc shape and substantially flat forward-facing surfaces that allow for mating of the inner segment 310 with the outer segment 350. The upper segment element 362 and the outer perimeter element 354 also include a plurality of openings 360 configured to receive the protruding mating elements 320 of the inner segment 310. The upper segment element 362 also includes protruding mating elements 364 configured for positioning within the elongated slots of the endcap.

Figure 3:
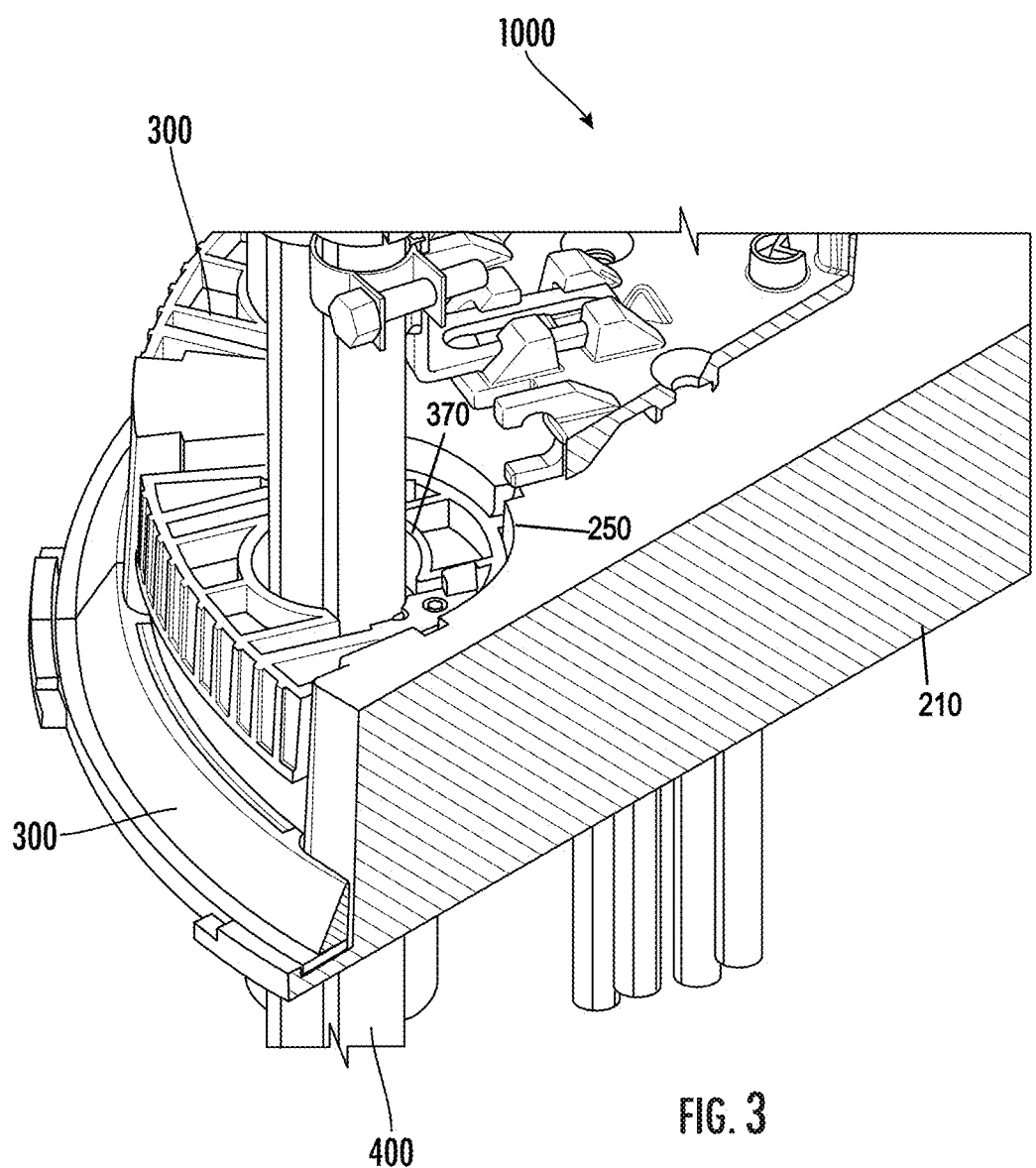
FIG. 3 is partial isometric view of a cross-section of the telecommunication closure shown in FIG. 1 with the cover assembly removed.
Figure 6:
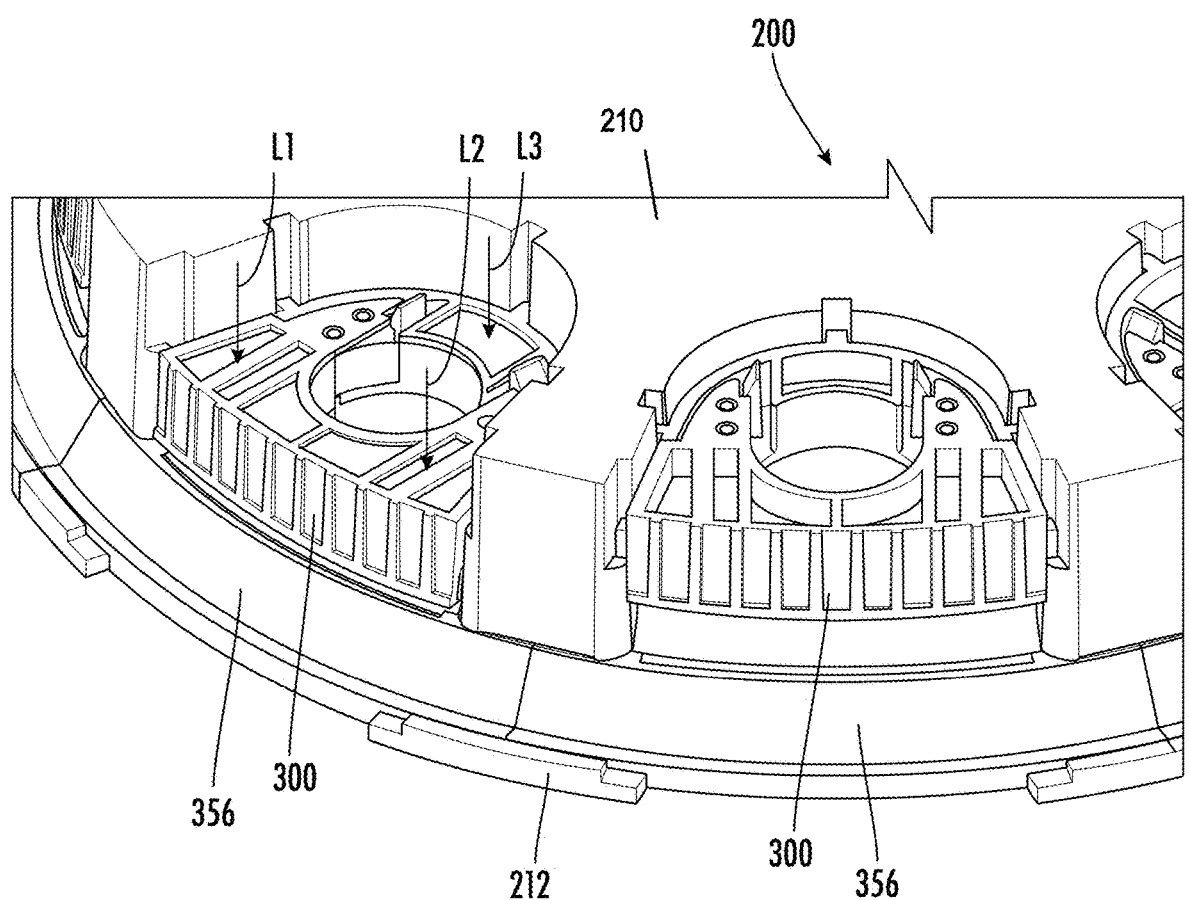
FIG. 6 is a partial isometric view of the plurality of sealing segment assemblies and the endcap shown in FIG. 5.
Figure 7:
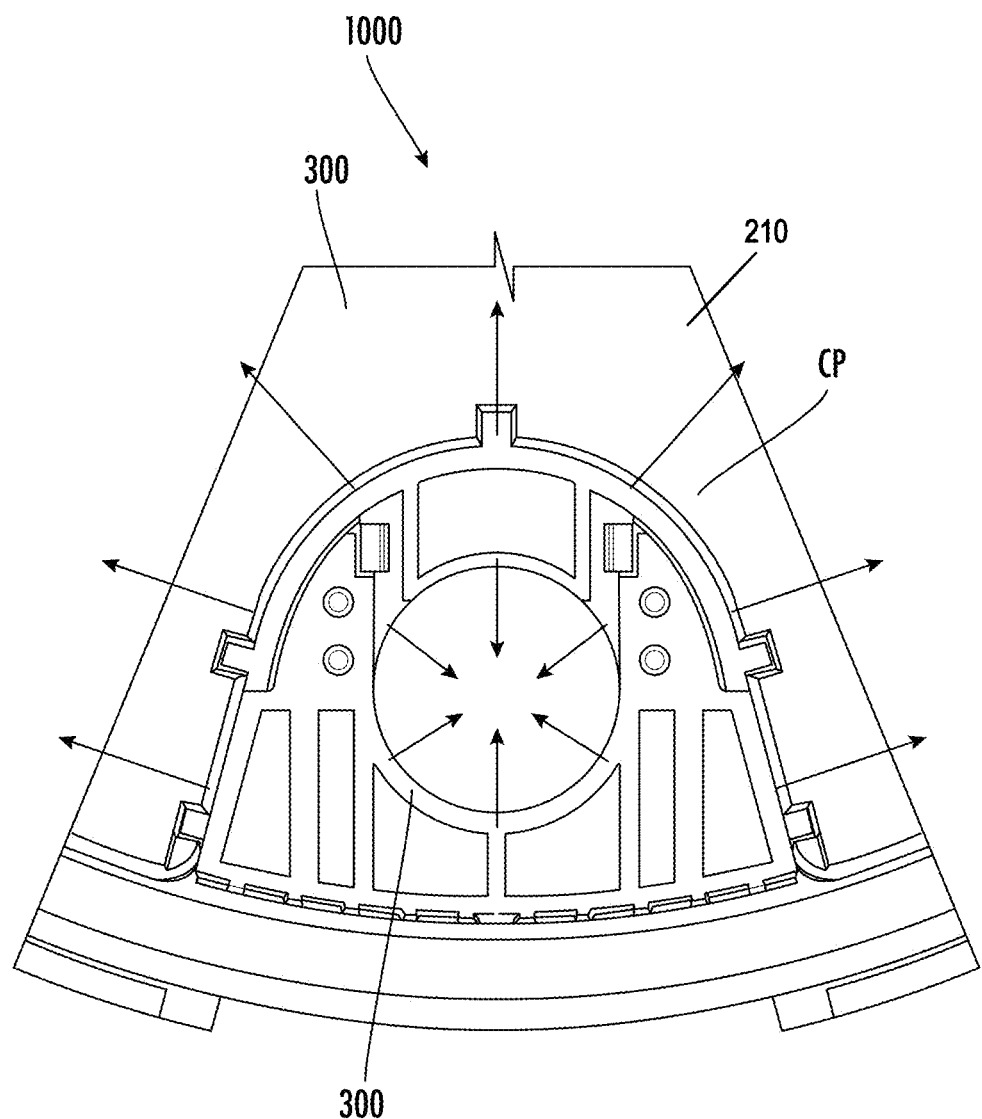
FIG. 7 is a partial top view of a sealing segment assembly and the endcap shown in FIG. 5.

Upon assembly, the inner segment 310 and the outer segment are configured to provide a sealing segment assemblies, which each act as a sealed cable port 370, allowing at least one cable to pass through in a sealed state, as particularly shown in FIG. 3. FIG. 6 shows the sealing segment assemblies in activated and released positions, with the activated positioning being schematically represented by arrows L1, L2, L3. A compressive force is applied to the sealing segment assembly to compress the sealing elements contained therein and move the sealing segment assembly downward.

In embodiments, the sealing elements shown and described herein may be manufacturing from one or materials having a Shore 000 hardness in the range of 20-80 or 30-60. The one or materials may have a compression set less than or equal to 10 percent, less than or equal to 15 percent, or less than or equal to 20 percent. Any material that meets these Shore 000 hardness and compression set requirements can be used.

In embodiments, the sealing elements are manufactured from a composition that includes a dry silicone gel or a polyurethane gel. As used herein, the term "dry silicone gel" may refer to a chemically crosslinked polymer having a Si—O backbone and comprising a relatively low amount, or no amount at all, of diluent fluids such as silicone oil or mineral oil. As opposed to carbon-based polymers, the crosslinked silicone polymers of dry silicone gels are based on a Si—O backbone. The characteristics of silicon and oxygen provide crosslinked polymers with their exceptional properties. For example, silicon forms stable tetrahedral structures, and silicon-oxygen bonds are relatively strong which results in dry silicone gels with high temperature resistance. In addition, crosslinked Si—O polymers have a relatively high chain flexibility as well as low rotational energy barrier.

The dry silicone gels may be made according to a number of different polymerization reactions. In certain embodiments, the polymerization reaction is a hydrosilylation reaction, also referred to as a hydrosilation reaction. In some embodiments, the hydrosilylation reaction makes use of a platinum catalyst, while other embodiments make use of radicals. In further embodiments, the dry silicone gel is made by a dehydrogenated coupling reaction. In other embodiments, the dry silicone gel is made by a condensation cure RTV reaction.

In certain embodiments, the dry silicone gel is made by reacting at least a crosslinker, a chain extender, and a base polymer (e.g., a vinyl-terminated polydimethylsiloxane). In certain embodiments, a catalyst is included to speed up the reaction. In additional embodiments, an inhibitor may be used to slow down the rate of reaction.

Polyurethane gels are typically formed from the reaction of a polyfunctional organic isocyanate with a polyfunctional isocyanate reactive material in the presence of a non-volatile inert liquid. The polyurethane component of the gel is typically cross-linked (thermoset) and the isocyanate reactive material contributes to flexibility. The loading of the non-volatile inert liquid in polyurethane gels is typically quite high. It is almost always higher than 10% by weight of the total gel composition, and is typically higher than 30% by weight of the total gel composition. Plasticizer loadings of greater than 50% of the total composition are well known. Plasticizers (typically inert, non-volatile liquids) that have been used in the past in preparing polyurethane gels include phthalate plasticizers (such as DIOP), vegetable oils, mineral oils, liquid resins such as polybutene resins, other kinds of ether and ester containing liquids, mixtures of these, and the like. [0119] For example, polyurethane gel can be made by gelling a mixture comprising conventional curable polyurethane precursor materials in the presence of substantial quantities of a mineral or vegetable oil or a mixtures thereof (e.g., in an amount of 60 to 80%) or a suitable plasticizer, e.g., a trimellitate such as n-octyl-n-decyl trimellitate (e.g., in an amount of 30 to 70%).

In some embodiments, the sealing element material(s) (e.g., a dry silicone gel or a polyurethane gel) has/have a hardness in the range of 20 to 80 Shore 000. In some embodiments, the sealing element material(s) (e.g., a dry silicone gel or a polyurethane gel) has/have a hardness in the range of 30 to 60 Shore 000. In other embodiments, the sealing element material(s) (e.g., a dry silicone gel or a polyurethane gel) has/have a hardness in the range of 37 to 45 Shore 000. In yet other embodiments, the cable sealing insert material (e.g., a dry silicone gel or a polyurethane gel) has a hardness in the range of 38 to 42 Shore 000. Shore 000 hardness referenced herein is residual hardness measured according to ASTM D2240 with a 30 second hold time.

In some embodiments, the cable sealing insert material (e.g., a dry silicone gel or a polyurethane gel) is compressed to about 50% of its original height. This causes a certain stress in the material. The stress is now reduced because the material relaxes. In certain embodiments, the stress relaxation of the cable sealing insert material is 20% to 70% when subjected to compression to about 50% of the original height of the material at 85° C., wherein the stress relaxation is measured after a one minute hold time. In certain embodiments, the stress relaxation of the cable sealing insert material is 30 to 60% when subjected to compression to about 50% of the original height of the material at 85° C., wherein the stress relaxation is measured after a one minute hold time. In other embodiments, the stress relaxation of the cable sealing insert material is 40% to 60% when subjected to compression to about 50% of the original height of the material at 85° C., wherein the stress relaxation is measured after a one minute hold time. A higher stress relaxation indicates that once a cable sealing insert material is installed in an enclosure, the cable sealing insert material will require less stress in order for it to seal.

Sealing materials (i.e., gel materials) that may be used for cable ports in accordance with the present disclosure can have certain material properties adapted to facilitate cable size range taking and reliable sealing in systems that optionally may not include a separate actuator for pressurizing the seal and for maintaining pressure on the sea lover extended times. For example, exemplary sealant materials can be defined by properties such as hardness, compression set, resistance to extrusion, elongation to failure, and oil bleed out properties.

It will be apparent to those skilled in the art that various modifications and variations can be made without departing from the spirit or scope of the disclosure. Since modifications, combinations, sub-combinations and variations of the disclosed embodiments incorporating the spirit and substance of the disclosure may occur to persons skilled in the art, the embodiments disclosed herein should be construed to include everything within the scope of the appended claims and their equivalents.

What is claimed is:

1. A sealing system for a telecommunication closure, comprising:
   an endcap having a plurality of slotted areas defined therein, the plurality of slotted areas each defining a plurality of elongated notches; and
   a plurality of sealing segment assemblies mounted to the endcap that when combined form a substantially continuous sealing perimeter around the endcap, wherein each sealing segment assembly is disposed in one of the plurality of slotted areas and comprises:
      an inner segment and an outer segment that when mated together are configured to seal at least one cable routed through a cable port opening; and
      mating elements disposed within the plurality elongated notches, wherein the plurality of elongate notches extend in a direction parallel to an axial direction of the cable port opening.

2. The sealing system of claim 1, wherein the endcap comprises an endcap body having an outer endcap rim with an upwardly extending edge and an inner endcap step positioned above the outer endcap rim.

3. The sealing system of claim 1, wherein each slotted area has a curved profile that includes a semi-circular section.

4. The sealing system of claim 1, wherein plurality of elongated notches are positioned at intervals along the inner surface of each slotted area.

5. The sealing system of claim 4, wherein the mating elements extend from an outer surface of the inner segment and the outer segment.

6. The sealing system of claim 1, wherein the endcap comprises end faces and wherein a tang extends from at least one of the end faces.

7. The sealing system of claim 6, wherein the tang is configured to align and connect the sealing segment assembly with the slotted area of the endcap.

8. A sealing segment assembly for a telecommunication closure, comprising:
   an inner segment;
   an outer segment configured to mate with the inner segment, wherein the inner segment comprises an upper segment portion, a lower segment portion, and an inner segment seal disposed between the upper segment portion and the lower segment portion; and wherein the outer segment comprises an upper segment element, and outer perimeter element, and an outer segment seal disposed between the upper segment element and the outer perimeter element, an inner surface of the outer segment and the inner segment defining a cable port opening when mated to one another; and
   mating elements extending from an outer surface the inner segment and/or the outer segment.

9. The sealing segment assembly of claim 8, wherein the upper segment portion comprises a plurality of protruding mating elements configured for insertion into the upper segment element, wherein the plurality of protruding mating elements extend in a direction parallel to an axial direction of the cable port opening.

10. The sealing segment assembly of claim 8, wherein lower segment portion comprises a plurality of protruding mating elements configured for insertion into the outer perimeter element.

11. The sealing segment assembly of claim 8, wherein the upper segment element has an arc shape.

12. The sealing segment assembly of claim 8, wherein the outer perimeter element has an arc shape.

13. The sealing segment assembly of claim 8, wherein the outer segment seal has an arc shape.

14. A telecommunication closure, comprising:
   a cover assembly; and
   a sealing system, comprising:
   an endcap having a plurality of slotted areas defined therein, the plurality of slotted areas each defining a plurality of elongated notches; and
   a plurality of sealing segment assemblies mounted to the endcap that when combined form a substantially continuous sealing perimeter around the endcap, wherein each sealing segment assembly is disposed in one of the plurality of slotted areas and comprises:
      an inner segment and an outer segment that when mated together are configured to seal at least one cable routed through a cable port opening; and
      mating elements disposed within the plurality elongated notches, wherein the plurality of elongate notches extend in a direction parallel to an axial direction of the cable port opening.

15. The telecommunication closure of claim 14, wherein the cover assembly comprises a cover and a clamping ring coupled to the cover.

16. The telecommunication closure of claim 15, wherein the cover is a dome-type cover.

17. The telecommunication closure of claim 15, wherein the clamping ring is positionable over a portion of the cover and further comprises a clamping arm.

18. The telecommunication closure of claim 17, wherein the clamping arm has an aperture defined therein.

19. The telecommunication closure of claim 18, wherein the aperture is configured to receive a cover fastener.

20. A method of sealing a cable disposed in a telecommunication closure comprising:
   positioning an inner segment into a slotted area of an endcap, the slotted area defining a plurality of elongated notches;
   positioning an outer segment into the slotted area wherein the outer segment defines mating elements which are disposed within the plurality of elongated notches; and
   coupling the outer segment and the inner segment together to form a cable port seal around one or more cables, wherein the plurality of elongate notches extend in a direction parallel to an axial direction of the cable port opening.

* * * * *